United States Patent [19]

Lopez

[11] Patent Number: 4,830,554
[45] Date of Patent: May 16, 1989

[54] ROUTING APPARATUS FOR CUTTING PRINTED CIRCUIT BOARDS

[75] Inventor: Gilbert T. Lopez, Longmont, Colo.

[73] Assignee: Cencorp, Inc., Boulder, Colo.

[21] Appl. No.: 157,801

[22] Filed: Feb. 19, 1988

Related U.S. Application Data

[63] Continuation of Ser. No. 877,344, Sep. 14, 1986, Pat. No. 4,742,615.

[51] Int. Cl.[4] .............................................. H05K 3/22
[52] U.S. Cl. ...................... 409/164; 29/414;
  29/417; 29/846; 83/27; 409/137; 409/190
[58] Field of Search ................ 29/412, 414, 417, 846;
  409/75, 132, 164, 137, 190; 83/27

[56] References Cited

U.S. PATENT DOCUMENTS

| | | | |
|---|---|---|---|
| 1,734,908 | 11/1929 | Jeffries | 409/132 |
| 3,587,390 | 6/1971 | Lohneis | 409/164 X |
| 4,138,924 | 2/1979 | Seebach | 29/846 X |
| 4,216,523 | 8/1980 | Harford | 29/414 X |
| 4,343,084 | 8/1982 | Wilmarth | 29/412 X |
| 4,621,552 | 11/1986 | Lopez | 83/27 |
| 4,657,452 | 4/1987 | Astigiano et al. | 409/190 |
| 4,742,615 | 5/1988 | Lopez | 29/846 |

Primary Examiner—Carl E. Hall
Assistant Examiner—Taylor J. Ross
Attorney, Agent, or Firm—Fidelman & Wolffe

[57] ABSTRACT

Routing a circuit board from the bottom side allows board removal from areas not generally accessible from the top side, such as board areas which are overhung by top side, such as board areas which are overhung by electrical connector "headers", as well as variable potentiometer and capacitor controls which may not be easily accessible from the top side. One embodiment combines such routing with shearing to merge their respective advantages.

4 Claims, 3 Drawing Sheets

ROUTING APPARATUS FOR CUTTING PRINTED CIRCUIT BOARDS

This application is a continuation of Ser. No. 887,344, filed June 23, 1986, now U.S. Pat. No. 4,742,615.

CROSS-REFERENCE TO PRIOR ART

U.S. Pat. No. 4,621,552, issued Nov. 11, 1986—Lopez—Method and Apparatus for Separating Printed Circuit Boards From Multi-Board Panels, filed Jan. 4, 1985.

BACKGROUND AND SUMMARY OF THE INVENTION

Substantial savings of time and money have been realized in the industry by handling a plurality of printed circuit boards (PCB's) while they are still interconnected in a panel of substrate material. Better utilization is realized with this approach in such processing as population of the PCB's with components, wave soldering of the populated boards, and quality control such as electrical function testing of whole boards or selected components, particularly when considering the automated processing demands of today's industry.

Methods presently used for separating each unpopulated or prepopulated panel into plural, individual PCB's include: shearing; routing; and the "break-away" methods of routing with tabs; scoring; perforation; and punch-back.

Routing with the tabs comprises routing slots in the panel (while leaving spaced support tabs) to define the perimeters of the individual boards, so that the tabs may be cut or broken in order to perform board separation.

Scoring comprises grooving board perimeters on at least one side of the panel in order to effect board separation by breaking along the score-lines.

Perforation comprises drilling a series of closely spaced holes in the panel along the board perimeters so that board separation is performed by breaking along the lines of perforations.

The punch-back method utilizes a custom-made die to punch each board out of the panel and then pull it back into the panel so that, after population, the boards are easily pushed from the panel.

"Break-away" methods of preparing panels for subsequent separation of the populated PCB's inherently rob the panel of its rigidity. Conseqently, the panels are prone to sagging during wave soldering, excessive warping, and premature breakage prior to subsequent separation into individual circuit boards. Moreover, methods incorporating excessive treatment by a router are expensive, can permit solder to overflow onto the component side of the panel during wave soldering, and often can require a secondary procedure for removing tab stubs. Perforation and scoring yield poor quality edges and cannot hold close tolerances. Punch-back methods require expensive tooling and cannot process zero-spaced configurations, i.e., panels without scrap strips between adjacent circuit boards. Premature separation during panel handing is frequently encountered with the punch-back and scoring methods.

Whether or not the boards have been populated, high precision shearing and routing are recognized as preferred, cost-effective methods for PCB profiling by separating individual boards from the panels. The shock to delicate components and traces, normally encountered during the separating of boards from panels by breaking along perforation or score lines, can be obviated by use of router bits and shearing blade configurations. Further, a panel may be gently sheared or routed without the shock of other methods, while providing excellent edge quality and holding board perimeter tolerances within 0.005 inches, repeatedly. Since there are no tab stubs to be removed with the shearing method, the circuit boards often can be zero-spaced (without waste strips) in order to provide more boards per panel. So called external, straight outs can be performed by shearing in less time than it takes to cut the same run with an NC router, while routing can provide internal, irregular, and curvilinear cuts which can not be accomplished with shearing. Thus, routing and shearing can be combined in order to minimize the routing time and maximize panel rigidity. The clean edges provided by shearing and routing also enhance computer aided design and manufacturing (CAD/CAM).

One presently used method of routing prepopulated panels in order to separate them into individual circuit boards has the router positioned on the same side of the substrate as the component bodies during the routing, thus presenting several problems which the instant invention overcomes. For instance, this prior art method is limited by the heighth of the components when it is necessary for a thin cut to be made in the substrate between two closely spaced components when at least one of the components is over one inch in height, since a router bit which is of sufficiently small diameter to accomplish such a cut will be too unstable and fragile over such a length. Further, areas of the circuit board which are overhung by components or portions of certain components, are shielded from overhead operation by the prior art router. This prior art also requires that the panels are laying on a flat surface, which must be cork board or the like in order to accommodate the leads protruding from the bottom side thereof.

The instant invention is particularly directed to the method and apparatus for automated handling of panels comprising a plurality of interconnected substrates in order to control and separate the circuit boards in a continuous processing line.

One embodiment incorporates both routing and shearing at a cutting station through which an individual or multiboard panel is fed, with the board being at any of three different levels at the cutting station and above the router. At a lowest level, the board rests on a fixed lower die for shearing by a movable shearing blade. A mid-level allows the downwardly protruding leads of components on the board to clear the fixed die during feeding of the board, while still allowing routing of the board during such feeding. The highest level allows lateral positioning of the router for plunge cuts and the like, without board interference.

Another embodiment provides for routing of a circuit board, with or without shearing, wherein the router is positioned on the "bottom" side of the substrate from the "top" or component body side. Thus, components heights and overhangs do not limit the cuts.

Throughout the handling of the panels and panel portions, sensing, gripping, and indexed feeding of the panels and panels portions are under the control of a programmable computer.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE INVENTION

For a better understanding of some particular portions of the invention, the reader is referred to the above cross-reference U.S. Pat. No. 4,621,552, issued Nov. 11, 1986, and the disclosure therein is incorporated into this disclosure by reference.

Figure 1:
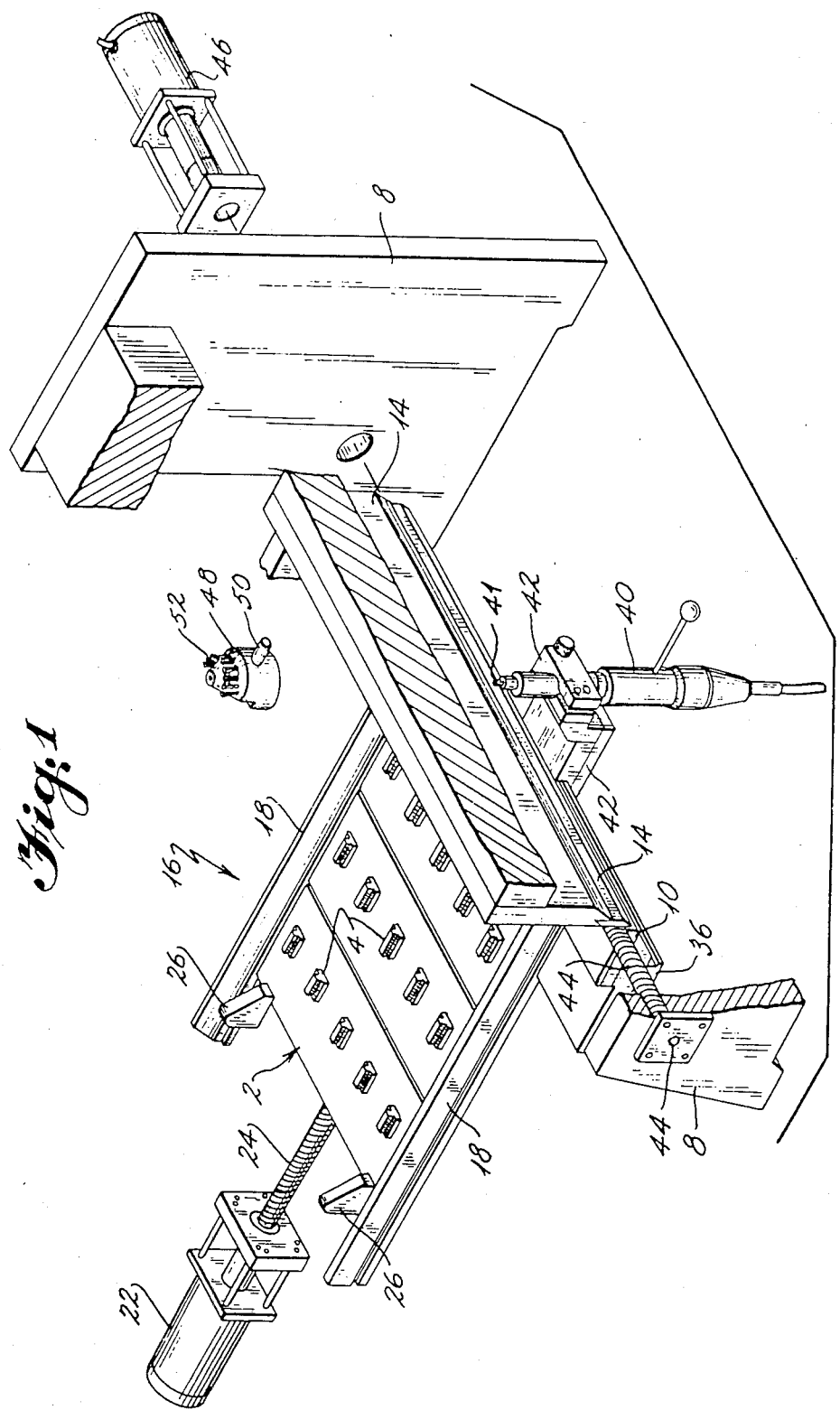
FIG. 1 is a partially exploded isometric of one embodiment of the invention.
Figure 2:
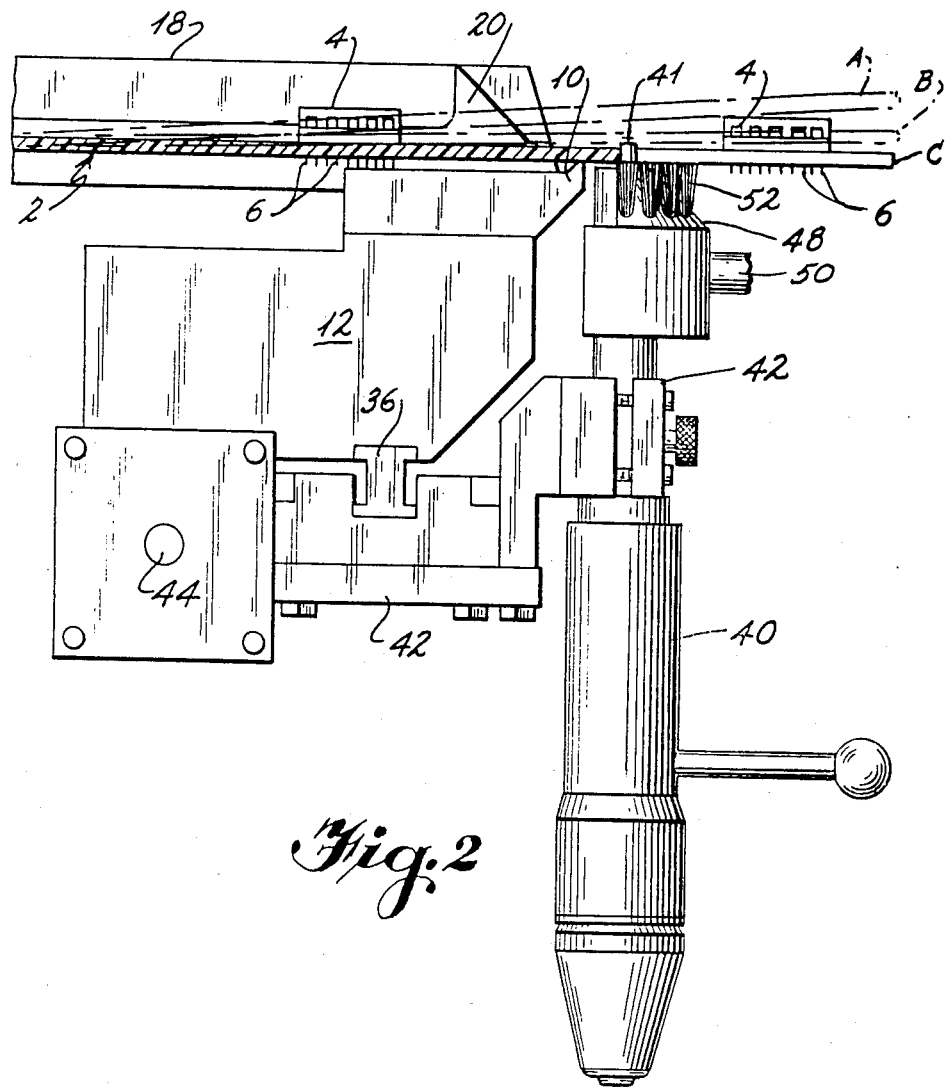
FIG. 2 is a partial side elevation of the device of FIG. 1.
Figure 3A:
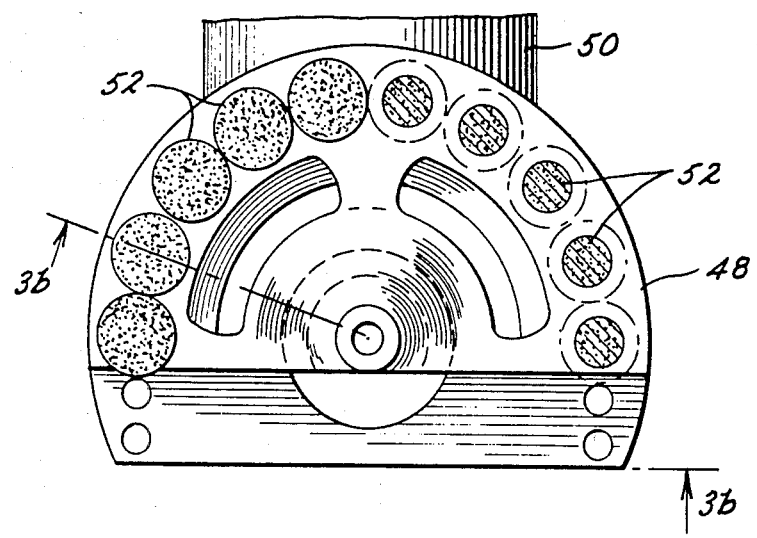
FIGS. 3a and 3b are views of the bull nose assembly.
Figure 3B:
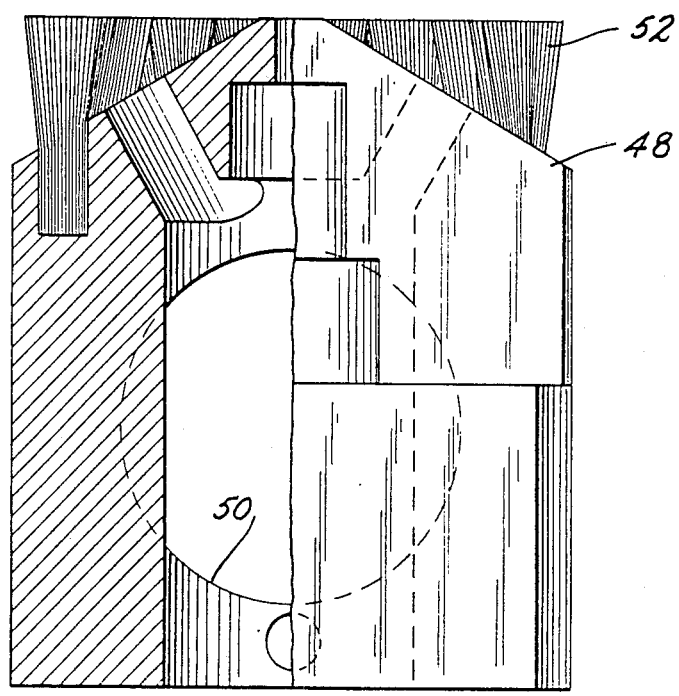

A main frame 8 supports a fixed die 10 and vertically reciprocatable shearing blade 14 so as to provide straight line separation of portions of the panel 2. Panel 2 is fed between the blade 14 and die 10 while clamped by clamping members 26 which are attached to a feed screw 24 which, in turn, is driven by board feeding motor 22. Side guides 18 of a feed assembly 16 substantially the same as in the above cross-referenced application, has hold-down members 20, as seen in FIG. 2. The panel 2 rests upon a pair of spaced rails (not shown) with a "bump" cylinder or the like allowing downstream raising of the rails and circuit board at the shear assembly. Such clamping, feeding, and "bumping" apparatus is well illustrated in the above referenced patent. However, a particular modification of the instant invention provides three different levels for the circuit board at the cutting station, as will be described during the discussion of the router.

Main frame 8 supports a feed screw 44 which is actuatable by a lateral positioning motor 46 so as to reciprocate a bracket 42 back and forth along screw 44. Attached to bracket 42 is a router tool provided with a bull nose 48 and a typical routing bit 41. As more clearly seen in FIG. 2, the router is positioned generally beneath the circuit board, with bracket 42 supported for such lateral movement by slide 36.

Referring to FIG. 2, position A of the circuit board allows the router to be positioned laterally underneath the board prior to the actual cut, thus allowing for plunge cutting from any point on the surface of the board to another point on the surface of the board. In the middle level, the board is raised sufficiently above fixed die 10 such that the downwardly protruding leads 6 of a component 4 just clear die 10 so that board 2 may be fed forwardly without interference by die 10. As will be appreciated, any number of variations of regular and irregular straight and curvilinear cuts may be made in the board by the router when considering that the router may move laterally various distances and at various speeds relative to the speed of board feeding provided by motor 22. In the bottommost position C, the board rests upon fixed die 10 for shearing by blade 14. In the illustrated embodiment, the router is positioned so close to die 10 that it must be shifted away from the cutting station during the shearing action, as by laterally shifting it to one end or the other of screw 44. Bull nose 48 is provided to limit the depth of cut of the routing bit 41, since it has been found that the router tends to draw the board toward it during such cutting. By means of a vacuum fitting 50, vacuum is applied within bristles 52 so as to evacuate all of the debris from such routing.

In an alternate embodiment of the invention, the shearing blade may be disabled or not provided such that all cutting is provided by the router which operates on the board from the bottom side. Other alternate embodiments will become apparent to those of ordinary skill in the art, such as a provision that router 40 may be vertically reciprocatable instead of the need for shifting the circuit board up to allow for lateral positioning and plunge cuts. No details have been provided other than referral to the earlier cross-referenced application regarding the "bumping" action since various modifications thereof may be made in order to provide for such shifting of the level of the circuit board. For instance, the bump cylinder of the earlier application could be provided with a variable stroke or two different cylinders could be provided such that firing both of them would raise the feed assembly the most, firing only one of them would raise it only to the mid level, and not firing of the cylinders would provide for the lowest level of the circuit board.

Having described the invention, it will be seen that the objects set forth above, among those made apparent from the preceding description, are efficiently obtained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention hereindescribed, and all statements of the scope of the invention, which as a matter of language, might be said to fall therebetween.

I claim:

1. In an apparatus for cutting a circuit board with a router, said circuit board having component mounted on and protruding from at least a first side thereof, the improvement comprising:
   means for restraining said board with said first side spaced from interferring surfaces by an amount at least equal to protrusion of a tallest one of said components from said first side in order to maintain said board in a plane generally perpendicular to a router plunge axis and to provide for routing through said board from a second side opposite of said board from said first side and so as to remove by routing circuit board portions which are overhung by portions of said components on said first side and thus generally inaccessable to a router from said first side.

2. The improvement as in claim 1, and further comprising:
   first moving means for moving said router relative to said circuit board in directions generally parallel to said board surface in order to provide straight and curvilinear cutting of the board by the router.

3. The improvement as in claim 2, and further comprising:
   second moving means for moving said router relative to said board in a direction generally perpendicular to said board surfaces in order to position selected locations on said board opposite of said router and to perform plunge cuts into said board at said selected locations.

4. The improvement as in claim 3, said means for restraining comprising:
   means for restricting at least two edges of said board in directions generally perpendicular to said board surface in order to effect said plunge cuts.

* * * * *